(12) United States Patent
Gao et al.

(10) Patent No.: US 10,916,606 B2
(45) Date of Patent: Feb. 9, 2021

(54) OLED LIGHT EMITTING DEVICE, PREPARATION METHOD THEREOF AND DISPLAY DEVICE

(71) Applicant: BOE TECHNOLOGY GROUP CO., LTD., Beijing (CN)

(72) Inventors: Hao Gao, Beijing (CN); Yansong Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/611,410

(22) PCT Filed: Apr. 2, 2019

(86) PCT No.: PCT/CN2019/081011
§ 371 (c)(1),
(2) Date: Nov. 6, 2019

(87) PCT Pub. No.: WO2019/196708
PCT Pub. Date: Oct. 17, 2019

(65) Prior Publication Data
US 2020/0168677 A1 May 28, 2020

(30) Foreign Application Priority Data
Apr. 9, 2018 (CN) .......................... 2018 1 0310842

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5268* (2013.01); *H01L 51/56* (2013.01); *H01L 27/3211* (2013.01)

(58) Field of Classification Search
CPC . H01L 27/3211; H01L 27/3246; H01L 51/56; H01L 51/525; H01L 51/5268; H01L 2251/5369
See application file for complete search history.

(56) References Cited

U.S. PATENT DOCUMENTS 8,987,767 B2 3/2015 Lee et al.
2008/0297029 A1* 12/2008 Cok ..................... H01L 51/5012
313/498

(Continued)

FOREIGN PATENT DOCUMENTS

CN 101647134 A 2/2010
CN 102272973 A 12/2011

(Continued)

OTHER PUBLICATIONS

First Office Action dated May 5, 2019 corresponding to Chinese application No. 201810310842.5.

(Continued)

*Primary Examiner* — Caridad Everhart
(74) *Attorney, Agent, or Firm* — Nath, Goldberg & Meyer; Joshua B. Goldberg

(57) ABSTRACT

The present disclosure provides an OLED light emitting device including a plurality of pixel defining structures disposed on a substrate, the plurality of pixel defining structures include a substrate layer and a plurality of particles randomly distributed in the substrate layer, the particles are capable of scattering light incident thereon, and the substrate layer of the pixel defining structures has a non-uniform density.

16 Claims, 4 Drawing Sheets

(56) References Cited

U.S. PATENT DOCUMENTS

| | | | |
|---|---|---|---|
| 2013/0228801 A1* | 9/2013 | Lee | H01L 51/5268 |
| | | | 257/88 |
| 2014/0145585 A1* | 5/2014 | Choi | H01L 51/5259 |
| | | | 313/504 |
| 2014/0167085 A1* | 6/2014 | Lee | H01L 27/3295 |
| | | | 257/98 |
| 2015/0255754 A1 | 9/2015 | Moon et al. | |
| 2018/0151826 A1* | 5/2018 | Huang | H01L 51/5064 |

FOREIGN PATENT DOCUMENTS

| | | |
|---|---|---|
| CN | 103490018 A | 1/2014 |
| CN | 103943785 A | 7/2014 |
| CN | 104218180 A | 12/2014 |
| CN | 107170781 A | 9/2017 |
| CN | 206541858 U | 10/2017 |
| CN | 108470845 A | 8/2018 |

OTHER PUBLICATIONS

Second Office Action dated Mar. 3, 2020 corresponding to Chinese application No. 201810310842.5.

* cited by examiner

OLED LIGHT EMITTING DEVICE, PREPARATION METHOD THEREOF AND DISPLAY DEVICE

CROSS-REFERENCE TO RELATED APPLICATION

This is a National Phase Application filed under 35 U.S.C. 371 as a national stage of PCT/CN2019/081011, filed Apr. 2, 2019, an application claiming the benefit of Chinese Patent Application No. 201810310842.5, filed on Apr. 9, 2018, entitled "OLED LIGHT EMITTING DEVICE, PREPARATION METHOD THEREOF AND DISPLAY DEVICE", the entire contents of each of which are hereby incorporated by reference.

TECHNICAL FIELD

The present disclosure belongs to the field of display technologies, and in particular, to an OLED light emitting device, a preparation method thereof, and a display device.

BACKGROUND

A conventional OLED light emitting device is usually provided with a plurality of spacers between the TFT back plate and the cover plate as a support between the upper and lower plates. It is only necessary to set the spacers on the pixel defining structure between the partial pixels to meet the requirement of the support. However, a problem of asymmetrical color shift in different pixels resulted from the asymmetric arrangement of the spacers on the pixel defining structures between pixels will occur, which affects display of the product.

SUMMARY

The present disclosure provides an OLED light emitting device including a plurality of pixel defining structures disposed on a substrate, the plurality of pixel defining structures include a substrate layer and a plurality of particles randomly distributed in the substrate layer, the particles are capable of scattering light incident on the particles, and the substrate layer of the pixel defining structures has a non-uniform density.

Optionally, the particles have a regular shape or an irregular shape.

Optionally, the particles include one or more of spherical particles and cubic particles, and the particles have a particle size ranging from 1 to 50 nm.

Optionally, the particles are in a shape of a prism, and a bottom surface of the prism is approximately 1-2 µm and height of the prism is less than 500 nm.

Optionally, the particles include any one or a mixture of metal nanoparticles, organic nanoparticles and ceramic nanoparticles.

Optionally, the substrate layer is composed of polyimide.

Optionally, at least a portion of the pixel defining structures is provided with a spacer on a side facing away from the substrate.

Optionally, the substrate is covered with a planarization layer.

The present disclosure also provides a preparation method of an OLED light emitting device, including a step of forming a plurality of pixel defining structures on a substrate, wherein the pixel defining structures include a substrate layer and a plurality of particles randomly distributed in the substrate layer, the particles are capable of scattering light incident on the particles, and the substrate layer of the pixel defining structures has a non-uniform density.

Optionally, the forming a plurality of pixel defining structures on a substrate includes following preparation steps:
dispersing the particles in raw material liquid of the substrate layer to obtain a dispersion;
applying the dispersion to the substrate and curing to obtain a pixel defining layer;
patterning the pixel defining layer to obtain the plurality of pixel defining structures.

Optionally, a mass ratio of the particles to the raw material liquid of the substrate layer is approximately 5% to 8%; and the step of applying the dispersion to the substrate and curing to obtain a pixel defining layer includes: heating the raw material liquid of the substrate layer to approximately 280-300° C. and keeping for 0.5-1 h, so as to perform rapid curing.

Optionally, the forming a plurality of pixel defining structures on the substrate includes following preparation steps:
forming a structural layer on the substrate;
patterning the structural layer to obtain the plurality of particles;
applying raw material liquid of the substrate layer to the particles, curing and patterning the raw material liquid, and then obtaining the plurality of pixel defining structures.

Optionally, the step of applying raw material liquid of the substrate layer to the particles, curing and patterning the raw material liquid, and then obtaining the plurality of pixel defining structures includes: heating the raw material liquid of the substrate layer to approximately 280-300° C. and keeping for 0.5-1 h, so as to perform rapid curing.

Optionally, the particles have a regular shape or an irregular shape.

Optionally, the particles include one or more of spherical particles and cubic particles, and the particles have a particle size ranging from 1 to 50 nm.

Optionally, the particles are in a shape of a prism, and a bottom surface of the prism is approximately 1-2 µm and height of the prism is less than 500 nm.

Optionally, the particles include any one or a mixture of metal nanoparticles, organic nanoparticles and ceramic nanoparticles.

Optionally, at least a portion of the pixel defining structures is provided with a spacer on a side facing away from the substrate.

Optionally, the substrate is covered with a planarization layer.

The present disclosure also provides a display device including the above OLED light emitting device.

DETAILED DESCRIPTION OF THE EMBODIMENTS

To enable those skilled in the art better understand the technical solution of the present disclosure, the present disclosure is further described in detail in conjunction with the drawings and specific embodiments as follows.

Figure 1:
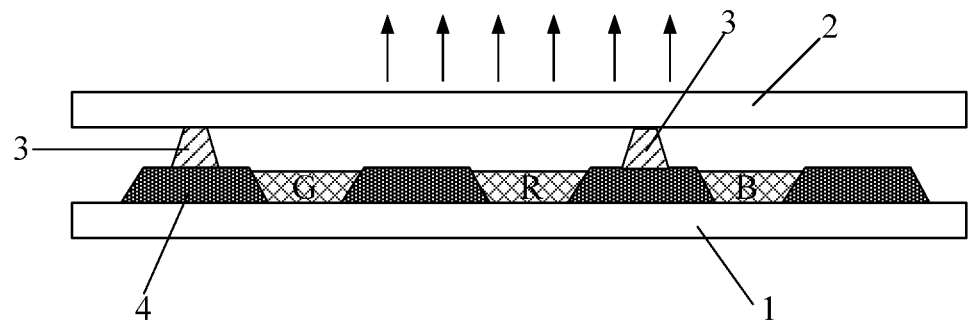
FIGS. 1 and 2 are schematic structural diagrams of a known OLED light emitting device.

As shown in FIG. 1, a related art of a top-emitting type OLED light emitting device is usually provided with a plurality of spacers 3 (Post Spacer, PS) between the TFT back plate 1 and the cover plate 2 as a support between the upper and lower plates. It is only necessary to set the PS on the pixel defining structure 4 (Pixel Defining Layer, PDL) between the partial pixels to meet the requirement of the support.

Figure 2:
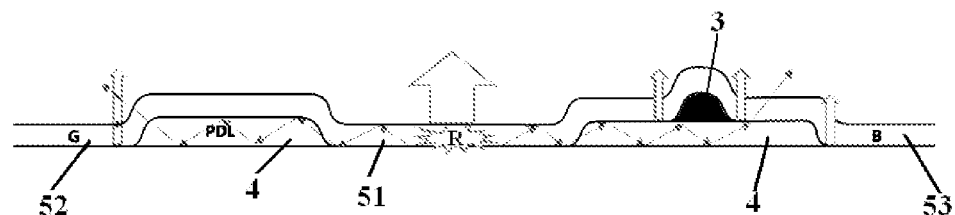

As shown in FIG. 2, most of the light emitted by the red pixel 51 is emitted from the upper light emitting surface, but a small portion of the light enters the left pixel defining structure 4. After multiple reflections in the PDL, the light is emitted at the edge of the green pixel 52. Similarly, small portion of the red light enters the right pixel defining structure 4, and after multiple reflections in the PDL, the light is emitted at the edge of the blue pixel 53. However, since the spacer 3 is provided on the pixel defining structure 4 between the red pixel 51 and the blue pixel 53 but not provided on the pixel defining structure 4 between the red pixel 51 and the green pixel 52, the presence of the spacer 3 has a certain influence on the reflection in the PDL, causing the color shift of the left green pixel 52 and the right blue pixel 53 to be asymmetrical, and resulting in poor display of the device.

Figure 3:
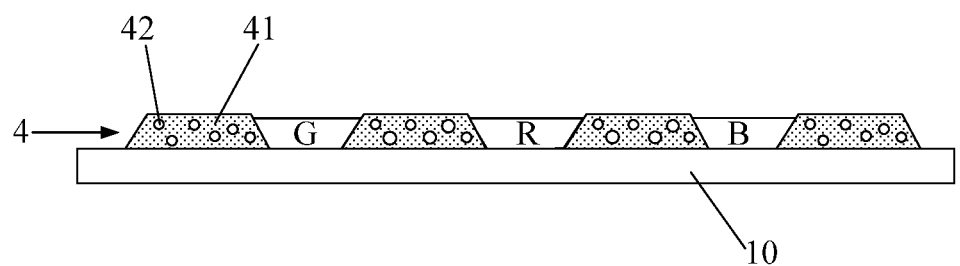
FIG. 3 is a schematic structural diagram of an OLED light emitting device according to an embodiment of the present disclosure.

The present disclosure provides an OLED light emitting device. As shown in FIG. 3, the OLED light emitting device includes a plurality of pixel defining structures 4 disposed on a substrate 10. The plurality of pixel defining structures 4 define a pixel region. The pixel defining structures 4 include a substrate layer 41 which is light-transmissive and a plurality of particles 42 randomly distributed in the substrate layer 41. The particles 42 are capable of scattering light incident thereon, and the substrate layer of the pixel defining structures has a non-uniform density.

In the pixel defining structures 4 of the OLED light emitting device in this embodiment, a plurality of particles 42 are distributed in the substrate layer 41; and the particles 42 are capable of scattering light incident thereon. The substrate layer of the pixel defining structures has a non-uniform density. After a small amount of light in the pixel region enters the pixel defining structure 4, a plurality of fine particles 42 present inside the pixel defining structure will diffusely reflect the light. The substrate layers with non-uniform density may also change the reflection path of incident light. The diffusely reflected light has a weak light intensity and do not affect the light output of other adjacent pixels. That is, the function of the particles 42 is to enhance the scattering property of the substrate layer 41, which can weaken or avoid the influence of the asymmetrical color shift caused by the spacers 3 disposed asymmetrically with respect to the pixels.

Figure 4:
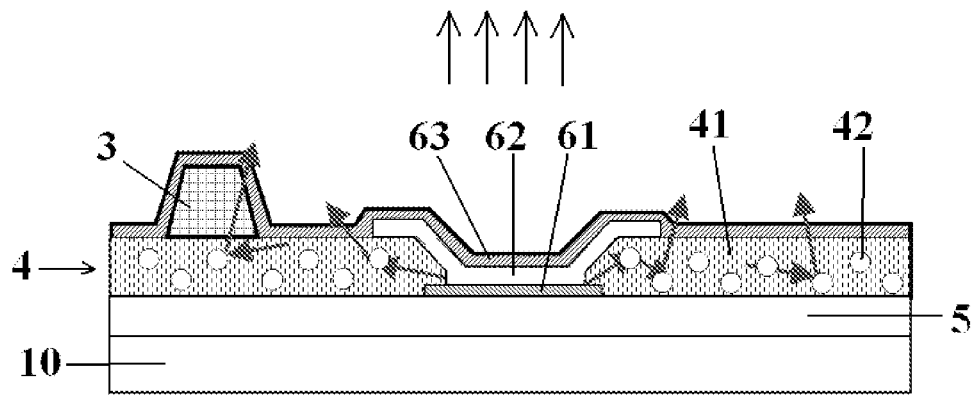
FIG. 4 is a schematic structural diagram of an OLED light emitting device according to another embodiment of the present disclosure.

The present disclosure also provides a top-emitting type OLED light emitting device. As shown in FIG. 4, the top-emitting type OLED light emitting device includes a plurality of pixel defining structures 4 disposed on a substrate 10. The plurality of pixel defining structures 4 define a pixel region. The pixel defining structures 4 include a substrate layer 41 which is light-transmissive and particles 42 randomly distributed in the substrate layer 41. The particles 42 are capable of scattering light incident thereon, and the substrate layer of the pixel defining structures has a non-uniform density.

The substrate 10 of this embodiment includes a pixel driving circuit (not shown). Optionally, it is shown in the corresponding FIG. 4 that the pixel driving circuit is covered with a planarization layer 5. The substrate layer 41 of the pixel defining structure 4 is disposed on the planarization layer 5, and the plurality of particles 42 in the substrate layer 41 diffusely reflect light entering the substrate layer 41. The intensity of the diffusely reflected light is weak, which can weaken or avoid the influence of the asymmetrical color shift caused by the spacers 3 disposed asymmetrically with respect to the pixels.

Also shown in FIG. 4 corresponding to this embodiment, at least a portion of the pixel defining structure 4 is provided with a spacer 3 on a side facing away from the substrate 10.

The spacer 3 is a support between the substrate and an upper cover plate (not shown), and it is only necessary to dispose the spacer 3 on the pixel defining structure 4 between the partial pixels to meet the requirement of the support.

Also shown in FIG. 4 corresponding to this embodiment, the pixel region includes an anode 61, a cathode 63, and a light emitting layer 62 disposed between the anode 61 and the cathode 63.

In an embodiment, the particles 42 include one or more of spherical particles, prismatic particles, and cubic particles.

The shape of the particles 42 as shown in FIG. 4 is spherical. The specific shape of the particles 42 is not limited herein, and the particles 42 may have a relatively regular shape or an irregularly shape.

Further, the dispersion of the particles 42 in the substrate layer 41 may be uniform or irregular. Dispersion manner may be optional as long as the light can be diffusely reflected to reduce the light intensity of the light incident into the substrate layer 41.

The particle size of the particles 42 ranges from 1 to 50 nm. That is, the particles 42 in the substrate layer 41 are particles 42 having a particle size on nanometer scale, for example, particles having a particle size of 1 to 50 nm. Nano-sized particles 42 have a better scattering effect on light and have no effect on pixel display.

Figure 5:
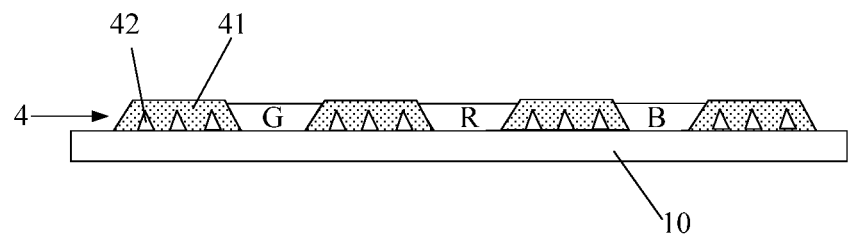
FIG. 5 is another schematic structural diagram of an OLED light emitting device according to another embodiment of the present disclosure.

In another structure of the pixel defining layer, as shown in FIG. 5, the particles 42 are in a shape of a prism, and a bottom surface of the prism is approximately 1-2 μm and height of the prism is less than 500 nm.

The specific material of the particles 42 is not limited in this embodiment. The particles 42 may include any one or a mixture of metal nanoparticles, organic nanoparticles and ceramic nanoparticles.

The specific material of the substrate layer 41 is not limited in this embodiment. The substrate layer may be composed of polyimide.

It should be noted that the specific material of the particles 42 needs to be matched with the material of the substrate layer 41, so that the particles 42 can be dispersed in the substrate layer 41 as a medium in the process of forming the pixel defining structure 4, so as to achieve the purpose of diffuse reflection of light by the fine particles.

By changing the density distribution of the substrate layer or adding heterogeneous particles to enhance the scattering of incident light, it is possible to change the optical path of a small amount of light incident inside the PDL, thereby weakening or avoiding the influence of PS on the optical path in the PDL. In this way, the problem of left and right asymmetrical color shift of the device caused by the PS is solved.

Figure 6:
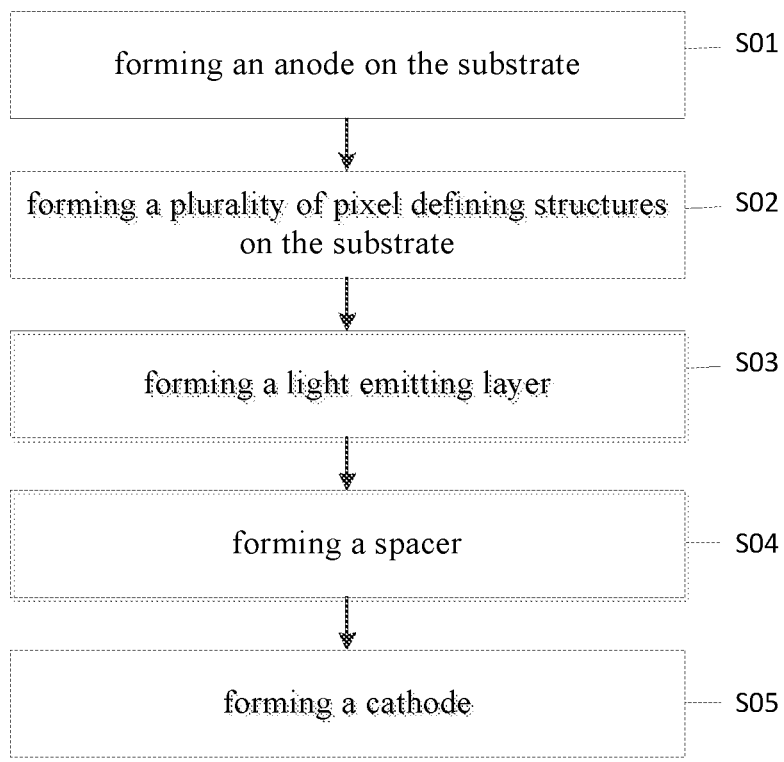
FIG. 6 is a schematic flow chart of a preparation method of an OLED light emitting device according to another embodiment of the present disclosure.

The present disclosure also provides a preparation method of an OLED light emitting device in above embodiments, as shown in FIG. 6, including following preparation steps:

S01, forming an anode 61 on the substrate 10, in which the substrate includes a pixel driving circuit. Optionally, the pixel driving circuit is covered with a planarization layer 5. The anode 61 has good electrical conductivity, and is generally made by using an inorganic metal oxide (such as indium tin oxide (ITO), zinc oxide (ZnO), etc.), organic conductive polymers (such as poly 3,4-ethylenedioxythiophene (PEDOT)/polystyrene sulfonate (PSS), polyaniline (PANI), etc.) or metal materials with high work function (such as gold, copper, silver, platinum, etc.). Generally, the thickness of the anode 61 ranges from 10 to 200 nm.

Figure 7:
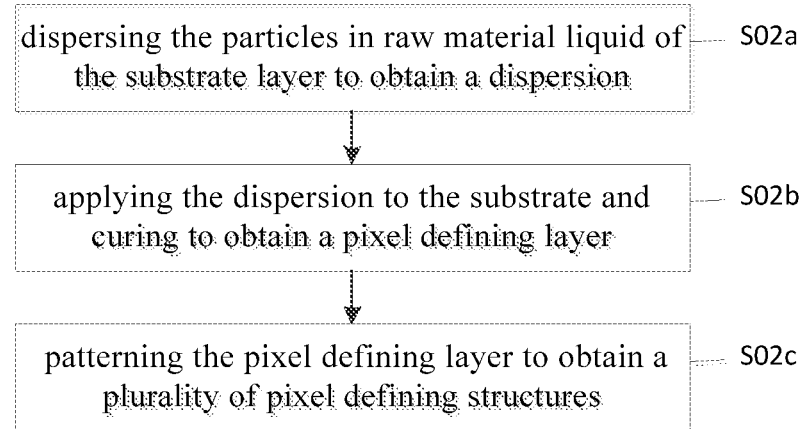
FIG. 7 is a schematic flow chart of a preparation method of a pixel defining structure of an OLED light emitting device according to another embodiment of the present disclosure.

S02, forming a plurality of pixel defining structures 4 on the substrate that completes the above steps. As shown in FIG. 7, forming a plurality of pixel defining structures specifically includes the following steps:

S02a, dispersing the particles 42 in raw material liquid of the light-transmissive substrate layer 41 to obtain a dispersion. Specifically, the metal nanoparticles, the organic nanoparticles or the ceramic nanoparticles may be dispersed in the pre-polymer of the polyimide.

The raw material liquid is usually transparent organic substance in liquid or fluid state, and a pre-polymer of polyimide can be applied here. It should be noted that if the content of the particles 42 is too large, the mechanical properties of the substrate layer 41 of the pixel defining structure 4 are easily affected. If the content of the particles 42 is too small, the diffuse scattering effect on the light is not significant. Optionally, a mass ratio of the particles 42 to the raw material liquid of the light-transmissive substrate layer 41 is 5% to 8%. When the content of the particles is in the range of 5% to 8%, it does not affect the mechanical properties of the substrate layer 41, while it can play a corresponding diffuse scattering effect on light.

S02b, applying the dispersion to the substrate and curing to obtain a pixel defining layer; in which specific process parameters of the curing can be adjusted according to actual needs, for example, a manner of light curing or heat curing may be applied.

The curing includes heating raw material liquid of the transparent substrate in the liquid or fluid state to approximately 280-300° C. and keeping for 0.5-1 hour (h), so as to perform rapid curing. Thereby a pixel defining layer having a non-uniform density is obtained.

S02c, patterning the pixel defining layer to obtain a plurality of pixel defining structures 4.

S03, forming a light emitting layer 62. The light emitting layer 62 may be made of an un-doped, fluorescent and light emitting organic material with a hole transporting ability not lower than an electron transporting ability; or an organic material doped with a fluorescent material, composed of fluorescent dopant and a matrix material; or an organic material doped with a phosphorescent material, composed of phosphorescent dopant and a matrix material. The thickness of the light emitting layer ranges from 10 to 50 nm.

S04, forming a spacer 3. The spacer 3 may be a spherical spacer or a column spacer. Generally, the spacer 3 may be formed by using a photoresist, or may be formed by using silicon nitride or silicon oxynitride. The thickness of the spacer 3 is 2.5-3 µm. It is only necessary to dispose the spacer 3 on the pixel defining structure 4 between the partial pixels to meet the requirement of the support.

S05, forming a transflective metal cathode 63. The cathode 63 may be a vacuum-evaporated single-layer material with high work function, or may be a multi-layer composite cathode 63, or may be formed of a doped material. Specifically, a layer of Mg/Ag alloy material may be vacuum-deposited as the cathode 63.

Figure 8:
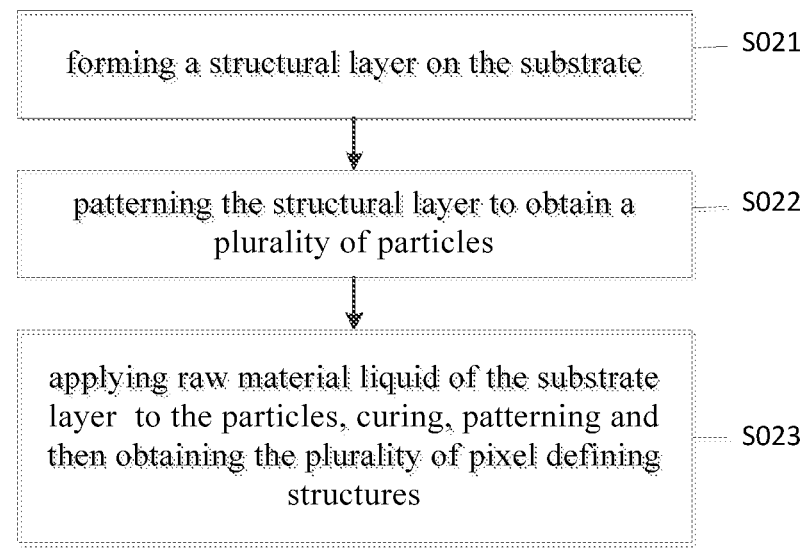
FIG. 8 is a schematic flow chart of a preparation method of a pixel defining structure of an OLED light emitting device according to another embodiment of the present disclosure.
Figure 9:
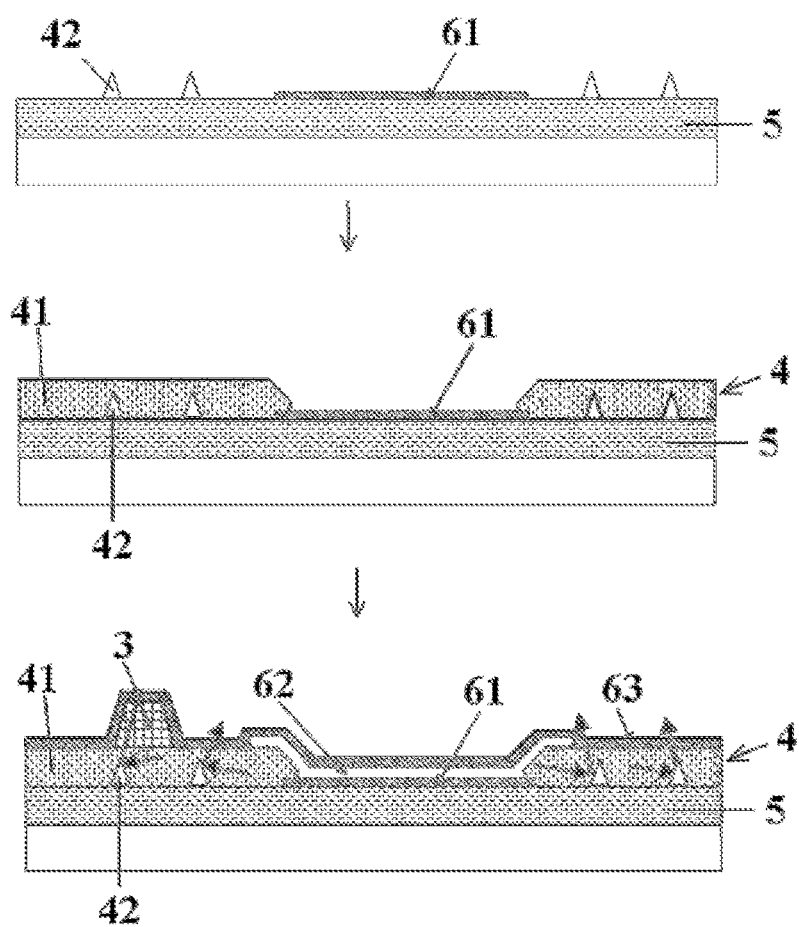
FIG. 9 is a process diagram of the preparation method of the pixel defining structure of FIG. 8.

The present disclosure provides a preparation method of an OLED light emitting device, which is similar to the method in the third embodiment, except that forming a plurality of pixel defining structures 4 as shown in FIGS. 8 and 9, specifically includes the following steps:

S021, forming a structural layer on the substrate that completes the above steps. The structural layer can be deposited to have a thickness of 1-1000 nm by deposition.

S022, patterning the structural layer to obtain a plurality of particles 42. The particles 42 may also be formed by etching or mask evaporation.

S023, applying raw material liquid of the light-transmissive substrate layer 41 to the particles 42, curing, patterning and then obtaining the plurality of pixel defining structures 4. The raw material liquid is usually transparent organic substance in liquid or fluid state, and a pre-polymer of polyimide can be applied here. A specific curing process is heating raw material liquid of the transparent substrate in the liquid or fluid state to approximately 280-300° C. and keeping for 0.5-1 hour (h), so as to perform rapid curing. Thereby a pixel defining layer having a non-uniform density is obtained.

In the OLED light emitting device prepared by the method of this embodiment, the light in the pixel defining structure 4 is also interfered by the particles 42 to change the original regular optical path of the incident light. Meanwhile, since the density of the substrate layer is not uniform, the optical path of a small amount of light incident on the substrate layer is also changed. Therefore, it can weaken or avoid the problem of asymmetrical color shift of the device in left and right perspective caused by a non-uniform optical path in the pixel defining structures 4 on both sides of the pixels due to the asymmetrical spacers 3.

It should be noted that size, thickness, and the like of each structural layer as shown in the drawings are merely illustrative. In the process, the projected area of each structural layer on the substrate may be the same or different. The required projected area of each structural layer can be achieved by an etching process. Meanwhile, the structure as shown in the drawings does not limit the geometry of each structural layer. For example, it may be a rectangle as shown in the drawing, or may be trapezoidal, or other shapes formed by etching, which may also be realized by etching.

The present disclosure provides a display device including any one of the above OLED light emitting devices. The display device may be any product or component having a display function, such as an electronic paper, an OLED panel, a mobile phone, a tablet computer, a television, a display, a laptop, a digital photo frame, a navigator, and the like.

The present disclosure improves the structure of the PDL layer. By changing the density distribution of the PDL layer or adding heterogeneous particles to enhance the scattering property of the PDL layer, it is possible to change the optical path of a small amount of light incident inside the PDL, thereby weakening or avoiding the influence of PS on the optical path in the PDL. In this way, the problem of left and right asymmetrical color shift of the device caused by the PS is solved. The process of the present disclosure is simple and easy to prepare.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

The invention claimed is:

1. An OLED light emitting device comprising a plurality of pixel defining structures disposed on a substrate, wherein the plurality of pixel defining structures comprise a substrate layer and a plurality of particles randomly distributed in the substrate layer, the particles are capable of scattering light incident on the particles, and the substrate layer of the pixel defining structures has a non-uniform density;
wherein the particles are in a shape of a prism, and a bottom surface of the prism is approximately 1-2 μm and height of the prism is less than 500 nm.

2. The OLED light emitting device according to claim 1, wherein the particles comprise one or more of spherical particles and cubic particles, and the particles have a particle size ranging from 1 to 50 nm.

3. The OLED light emitting device according to claim 1, wherein the particles comprise any one or a mixture of metal nanoparticles, organic nanoparticles and ceramic nanoparticles.

4. The OLED light emitting device according to claim 3, wherein the substrate layer is composed of polyimide.

5. The OLED light emitting device according to claim 4, at least a portion of the pixel defining structures is provided with a spacer on a side facing away from the substrate.

6. The OLED light emitting device according to claim 5, wherein the substrate is covered with a planarization layer.

7. A preparation method of an OLED light emitting device, comprising a step of forming a plurality of pixel defining structures on a substrate, wherein the pixel defining structures comprise a substrate layer and a plurality of particles randomly distributed in the substrate layer, the particles are capable of scattering light incident on the particles, and the substrate layer of the pixel defining structures has a non-uniform density;
wherein the particles are in a shape of a prism, and a bottom surface of the prism is approximately 1-2 μm and height of the prism is less than 500 nm.

8. The preparation method of an OLED light emitting device according to claim 7, wherein the forming a plurality of pixel defining structures on a substrate comprises following preparation steps:
dispersing the particles in raw material liquid of the substrate layer to obtain a dispersion;
applying the dispersion to the substrate and curing to obtain a pixel defining layer;
patterning the pixel defining layer to obtain the plurality of pixel defining structures.

9. The preparation method of an OLED light emitting device according to claim 8, wherein a mass ratio of the particles to the raw material liquid of the substrate layer is approximately 5% to 8%; and the step of applying the dispersion to the substrate and curing to obtain a pixel defining layer comprises: heating the raw material liquid of the substrate layer to approximately 280-300° C. and keeping for 0.5-1 h, so as to perform rapid curing.

10. The preparation method of an OLED light emitting device according to claim 7, wherein the forming a plurality of pixel defining structures on the substrate comprises following preparation steps:
forming a structural layer on the substrate;
patterning the structural layer to obtain the plurality of particles;
applying raw material liquid of the substrate layer to the particles, curing and patterning the raw material liquid, and then obtaining the plurality of pixel defining structures.

11. The preparation method of an OLED light emitting device according to claim 10, wherein the step of applying raw material liquid of the substrate layer to the particles, curing and patterning the raw material liquid, and then obtaining the plurality of pixel defining structures comprises: heating the raw material liquid of the substrate layer to approximately 280-300° C. and keeping for 0.5-1 h, so as to perform rapid curing.

12. The preparation method of an OLED light emitting device according to claim 11, wherein the particles comprise one or more of spherical particles and cubic particles, and the particles have a particle size ranging from 1 to 50 nm.

13. The preparation method of an OLED light emitting device according to claim 11, wherein the particles comprise any one or a mixture of metal nanoparticles, organic nanoparticles and ceramic nanoparticles.

14. The preparation method of an OLED light emitting device according to claim 13, at least a portion of the pixel defining structures is provided with a spacer on a side facing away from the substrate.

15. The preparation method of an OLED light emitting device according to claim 14, wherein the substrate is covered with a planarization layer.

16. A display device comprising the OLED light emitting device according to claim 1.

* * * * *